(12) United States Patent
Milla et al.

(10) Patent No.: US 6,670,217 B2
(45) Date of Patent: Dec. 30, 2003

(54) METHODS FOR FORMING A DIE PACKAGE

(75) Inventors: Juan G. Milla, Mesa, AZ (US); Mark R. Boone, Gilbert, AZ (US)

(73) Assignee: Medtronic, Inc., Minneapolis, MN (US)

( * ) Notice: Subject to any disclaimer, the term of this patent is extended or adjusted under 35 U.S.C. 154(b) by 3 days.

(21) Appl. No.: 10/135,911

(22) Filed: Apr. 29, 2002

(65) Prior Publication Data

US 2002/0123172 A1 Sep. 5, 2002

Related U.S. Application Data

(63) Continuation-in-part of application No. 09/734,073, filed on Dec. 11, 2000.

(51) Int. Cl.⁷ .......................... H01L 21/44; H01L 21/48; H01L 21/50
(52) U.S. Cl. ........................ 438/107; 438/109
(58) Field of Search ................. 257/686, 777, 257/778, 779, 781, 783, 784; 438/107, 1, 111, 118, 119, 614, 617

(56) References Cited

U.S. PATENT DOCUMENTS

| | | | |
|---|---|---|---|
| 5,281,852 A | 1/1994 | Normington | 257/685 |
| 5,291,061 A | 3/1994 | Ball | 257/686 |
| 5,345,205 A | 9/1994 | Kornrumpf | 333/246 |
| 5,386,341 A | 1/1995 | Olson et al. | 361/749 |
| 5,397,747 A | 3/1995 | Angiulli et al. | 438/109 |
| 5,448,511 A | 9/1995 | Paurus et al. | 257/686 |
| 5,452,182 A | 9/1995 | Eichelberger et al. | 361/749 |
| 5,646,446 A | 7/1997 | Nicewarner, Jr. et al. | 257/723 |
| 5,696,031 A | 12/1997 | Wark | 438/4 |
| 5,721,452 A | 2/1998 | Fogal et al. | 257/685 |
| 5,776,797 A | 7/1998 | Nicewarner, Jr. et al. | 438/107 |
| 5,963,794 A | 10/1999 | Fogal et al. | 438/108 |
| RE36,613 E | 3/2000 | Ball | 257/777 |
| 6,051,886 A | 4/2000 | Fogal et al. | 257/777 |
| 6,121,676 A | 9/2000 | Solberg | 257/686 |
| 6,208,521 B1 * | 3/2001 | Nakatsuka | 361/749 |
| 6,225,688 B1 | 5/2001 | Kim et al. | 257/686 |
| 6,246,114 B1 * | 6/2001 | Takahashi et al. | 257/696 |
| 6,486,544 B1 * | 11/2002 | Hashimoto | 257/686 |
| 6,507,095 B1 * | 1/2003 | Hashimoto | 257/676 |
| 2001/0006252 A1 | 7/2001 | Kim et al. | 257/688 |
| 2002/0044423 A1 | 4/2002 | Primavera et al. | 361/704 |

FOREIGN PATENT DOCUMENTS

| | | | | |
|---|---|---|---|---|
| CH | 689 502 A5 | 5/1999 | | H01L/27/00 |
| EP | 1 041 633 A1 | 10/2000 | | H01L/25/65 |
| EP | 1 119 049 A2 | 7/2001 | | H01L/25/65 |
| TW | 272 352 | 11/1996 | | H01L/23/28 |

OTHER PUBLICATIONS

"Stepped Pyramid Chip Stack", *Research Disclosure* No. 413088, IBMC, pp. 1234–1235 (Sep. 1998).

* cited by examiner

*Primary Examiner*—Phat X. Coa
*Assistant Examiner*—Hoai Pham
(74) *Attorney, Agent, or Firm*—Girma Wolde-Michael; Daniel G. Chapik

(57) ABSTRACT

Methods are provided for forming a die package. The method comprises stiffening a flexible substrate to provide a first flexibility of the flexible substrate, forming a mounting element on a first side of the flexible substrate, and mounting a first side of a die on a second side of the flexible substrate. In addition, the method comprises adjusting the stiffening to provide a second flexibility of the flexible substrate that is greater than the first flexibility, and positioning the flexible substrate to couple a contact of the flexible substrate with a second side of the die.

39 Claims, 9 Drawing Sheets

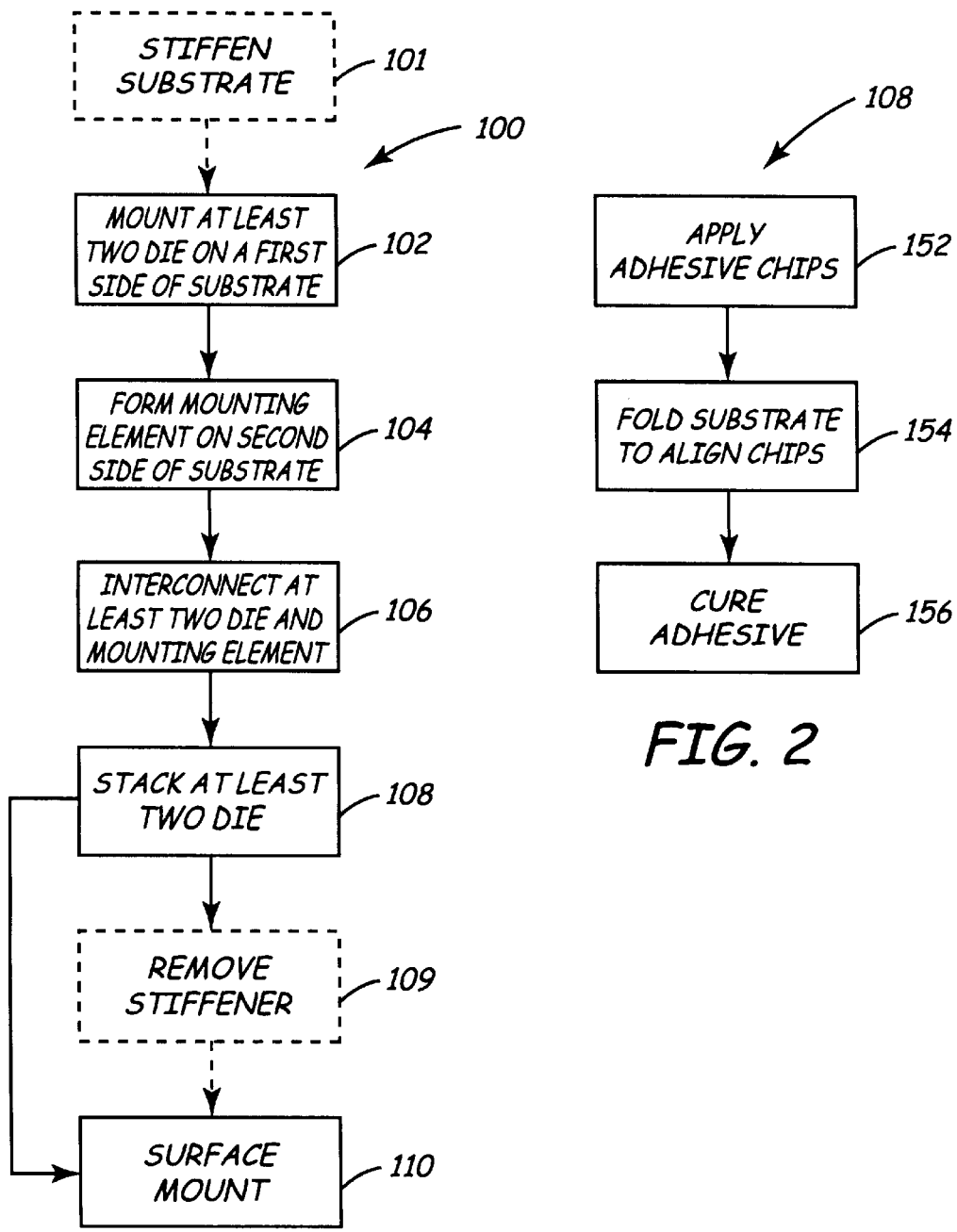

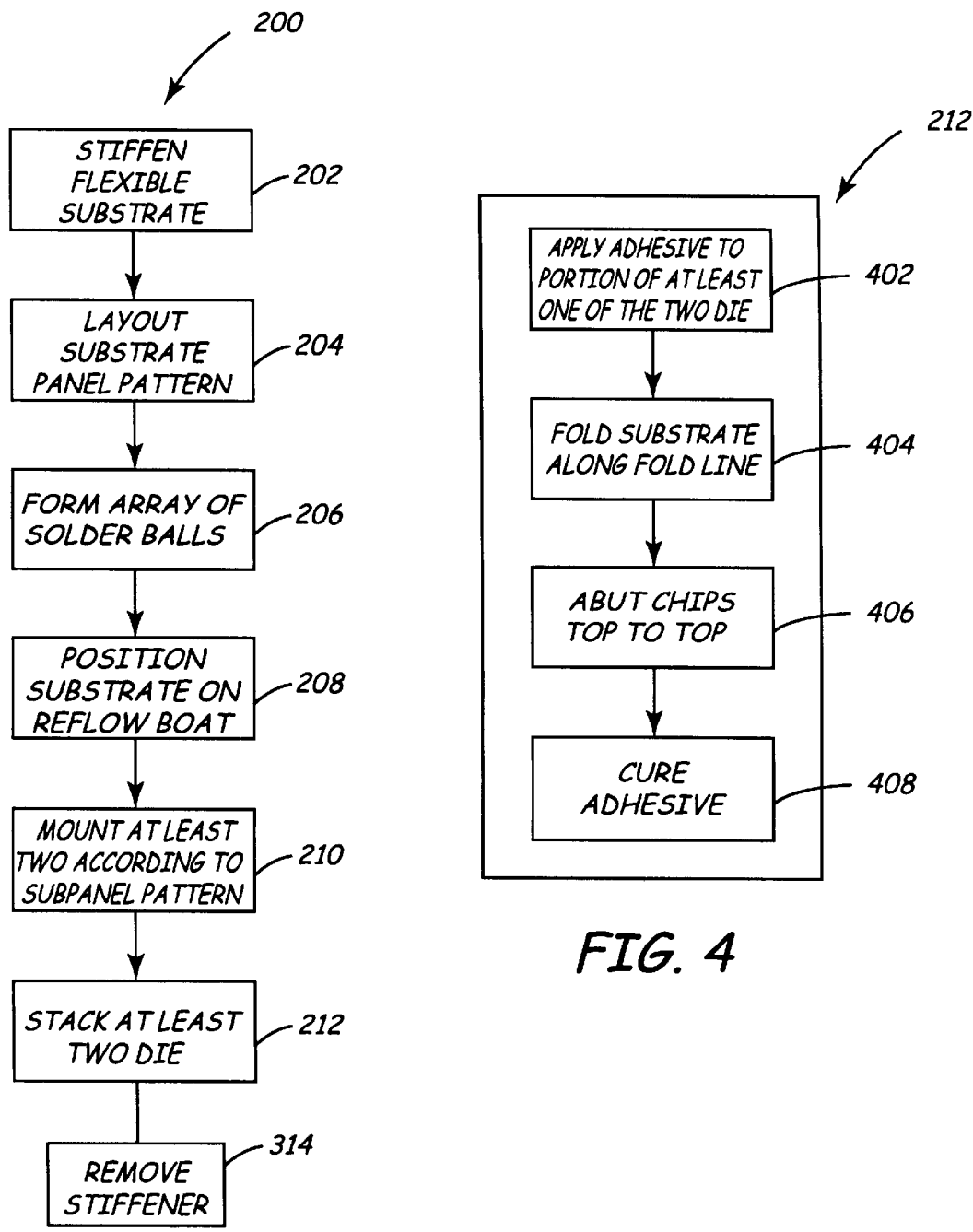

METHODS FOR FORMING A DIE PACKAGE

CROSS-REFERENCES TO RELATED APPLICATIONS

This is a continuation-in-part of U.S. application Ser. No. 09/734,073, filed on Dec. 11, 2000.

FIELD OF THE INVENTION

The present invention generally relates to die packaging, and more particularly methods for forming such a die package, specifically tailored for use in implantable medical devices (IMDs).

BACKGROUND OF THE INVENTION

Die packaging has continued to receive a significant amount of attention from designers and manufacturers of electronic products. This attention is based upon the market demand for products with greater efficiency, higher performance, and smaller dimensions. The market demand for smaller dimensions is driven to at least some extent by portable electronic product applications, such as Implantable Medical Devices (IMDs).

As the dimensions of an IMD package becomes smaller and smaller, and as more and more components are added to such a device, the area is reduced within the IMD package that is available for the additional components. Furthermore, as the dimensions of the components are also shrinking, it is desirable to improve the use of all three dimensions within the IMD package. While die packages have been designed and manufactured that improve the utilization of all three dimensions within electronic packages, including portable electronic packages such as IMD packages, improvements are sought to the die package and the methods of forming the die package. For example, designers and manufactures seek improvements in the efficiency and cost effectiveness of the flip chip package and the methods of forming the flip chip package.

In view of the foregoing, it should be appreciated that it would be desirable to provide methods for forming a die package, including a flip chip package. In addition, it would be desirable to improve the methods for forming a die package, such as improving the efficiency and cost effectiveness of such methods. Furthermore, additional desirable features will become apparent to one of ordinary skill in the art from the foregoing background of the invention and following summary, brief description of the drawings, detailed description of the drawings, and appended claims.

SUMMARY OF THE INVENTION

Methods for forming the die package are provided in accordance with the teachings of the present invention. The method comprises stiffening a flexible substrate to provide a first flexibility of the flexible substrate, forming a mounting element on a first side of the flexible substrate, and mounting a first side of a die on a second side of the flexible substrate. In addition, the method comprises adjusting the stiffening to provide a second flexibility of the flexible substrate that is greater than the first flexibility, and positioning the flexible substrate to couple a contact of the flexible substrate with a second side of the die.

BRIEF DESCRIPTION OF THE DRAWINGS

The present invention will hereinafter be described in conjunction with the appended drawing figures, wherein like numerals denote like elements, and:

FIG. 1 is a flow chart diagram of one embodiment of a method for forming a die package;

FIG. 2 is a flow chart diagram of one embodiment of a method for stacking die;

FIG. 3 is a flow chart diagram of another embodiment of a method for forming a die package;

FIG. 4 is a flow chart diagram of another embodiment of a method for stacking die;

DETAILED DESCRIPTION OF THE DRAWINGS

Figure 13:
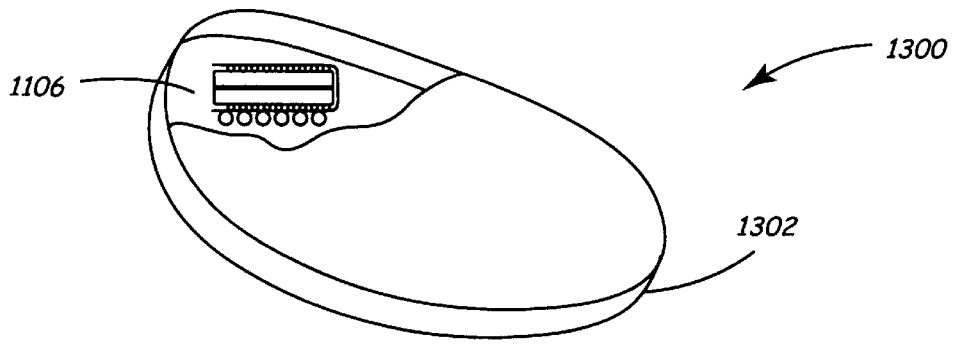
FIG. 13 is a view of an implantable medical device (IMD) formed according to one embodiment of the present invention.

In the following detailed description of the embodiments, reference is made to the accompanying drawings, which form a part hereof, and in which is shown by way of illustration specific embodiments in which the present invention may be practiced in accordance with the present invention. However, it is to be understood that other embodiments may be utilized and structural or logical changes may be made without departing from the scope of the present invention.

FIG. 1 is a flow chart illustrating a method 100 for forming a die package, which is preferably a stacked die package, according to one embodiment of the present invention. The method 100 comprises mounting at least two die (i.e., a first die and a second die) on a first side of a flexible substrate 102. The first die, second die, and/or other die of the die package can be an individual circuit element formed on or within a continuous substrate that is based on a single material or a composite of multiple materials. Alternatively, the first die, second die, and/or other die of the die package can be multiple coupled or interconnected circuits formed on or within a continuous substrate (e.g., an integrated circuit). The flexible substrate is preferably formed of a material that is flexible, which shall herein be generally defined as capable of modification, preferably defined as easily persuaded or influenced (i.e., tractable), and more preferably defined as the general ability to bend without breaking. The flexible substrate can be formed of any number of materials or combination of materials, such as a polyimide, polyesters, fluoropolymers epoxy films, polyethylene films, and fluorocarbon films.

The method 100 also comprises forming a mounting element on a second side of the flexible substrate 104, which preferably comprises one or more contacts such as an electrical contact (e.g., solder balls). The mounting element is preferably formed on the second side of the flexible substrate in a predetermined pattern, and more preferably formed on the second side of the flexible substrate in a predetermined array pattern. According to a preferred embodiment of the present invention, the mounting element is a solder ball array pattern configured for surface mounting of the die package. However, any number of electrical, optical or acoustic mounting elements can be used in accordance with the present invention.

The mounting of the at least two die on the first side of the flexible substrate 102 and the forming of the mounting element on the second side of the flexible substrate 104, and the other steps or sub-steps of the invention are presented in this detailed description of the drawings in a preferred sequential order. However, the mounting of the at least two die on the first side of the flexible substrate 102 and the forming of the mounting element on the second side of the flexible substrate 104 can be performed in a reversed order with the forming of the mounting element before the mounting of the at least two die without departing from the scope of the invention. Furthermore, other steps and sub-steps of the present invention can also be performed in other sequential orders as described without departing from the scope of the invention.

The at least two mounted die and the mounting element are preferably interconnected through the flexible substrate 106 with interconnects and/or vias formed on or within the flexible substrate, and the first die and the second die are stacked in a predetermined pattern 108. Once the first die and the second die are stacked in a predetermined pattern 108, the resulting stacked die package can be coupled to another device or device connectors 110, and preferably mounted to a surface (i.e., surface mounted).

In one embodiment, the flexible substrate is stiffened with a stiffener 101, which increases the rigidity of the flexible substrate and decreases the flexibility of the flexible substrate. While a specific exemplary embodiment of a stiffener is subsequently described in this detailed description of the drawings, the stiffener can be any number of devices and/or configurations and formed of any number of materials or combination of materials that increase the rigidity of the flexible substrate and decrease the flexibility of the flexible substrate. For example, and not by way of limitation, the stiffener can be a printed wiring board (PWB) formed of a metal, plastic, screen, composite, ceramic, and the like.

In one embodiment, the flexible substrate and stiffener are inverted after formation of the mounting element on the second side of the flexible substrate 104. Once the flexible substrate and stiffener are inverted, the flexible substrate is placed on a support structure such as a reflow boat, which among other things improves manufacturability, and the at least two die are mounted on the first side of the flexible substrate, preferably in the predetermined pattern. In one embodiment, the predetermined pattern is formed on the flexible substrate in a sub-panel format that has been determined for folding patterns and stacking of the at least two die, which is well known by those of ordinary skill in the art.

Once the at least two die have been stacked by adhering, folding, and curing as subsequently described in this detailed description of the drawings with reference to FIG. 2, and before the mounting of the stacked die package 110, at least part of the stiffener is removed from the flexible substrate 109, and preferably a substantial part and more preferably substantially all or the entire stiffener is removed from the flexible substrate. In one embodiment, the stiffener is cut away with a saw action, separating the stiffener and the flexible substrate, and leaving a stacked die package that is available for mounting, and preferably available for surface mounting. The arrangement and layout of the flexible substrate and the stiffener enables at least a portion of the stiffener, preferably a substantial portion of the stiffener, more preferably substantially all of the stiffener, and even more preferably the entire stiffener to be removed in a single cut of a saw, leaving multiple die packages, and preferably multiple stacked die packages that are ready for mounting.

Referring to FIG. 2, a flow chart is provided that illustrates greater detail of the stacking of the first die and the second die in a predetermined pattern 108 according to one embodiment of the present invention. The stacking of the first die and the second die preferably comprises applying an adhesive to at least one die 152, and folding the substrate and any attached stiffener in a predetermined fold pattern to align at least a portion of the first die and a portion of the second die 154, which are preferably stacked top-to-top (i.e., one inverted die and one non-inverted die). More preferably the folding of the substrate and any attached stiffener in a predetermined fold pattern substantially aligns a majority of the first die with the second die and even more preferably substantially aligns or completely aligns substantially all of the first die and the second die. Once the adhesive is applied to at least one of the die 152 and the substrate and any attached stiffener are folded in a predetermined fold pattern to align at least a portion of the first die and a portion of the second die 154, the stacking of the first die and the second die in a predetermined pattern 108 continues with the curing of the adhesive 156. The curing can be accomplished with any number of techniques and apparatus known to those of ordinary skill in the art, and the type of curing is generally a function of the adhesive.

In another embodiment, the method for forming a die package 200, which is preferably a stacked die package, is shown in FIG. 3. The method 200 comprises stiffening a flexible substrate 202, laying out a sub-panel pattern for die placement on a first side of the flexible substrate 204, forming a mounting element (e.g., an array of solder balls) on the other side of the flexible substrate (i.e., a second side of the flexible substrate) 206, positioning the flexible substrate on a reflow boat 208, and mounting at least a first die and a second die (i.e., at least two die) according to the sub-panel pattern 210. Once the first die and the second die have been mounted according to the sub-panel pattern, the flexible substrate is folded to stack the at least two die in a predetermined pattern 212. The stacking of the at least two die in the predetermined patter is shown in greater detail in FIG. 4 in accordance with one embodiment of the invention.

More specifically, and with reference to FIG. 4, the folding to stack the at least two die in the predetermined pattern 212 comprises applying an adhesive to at least a portion of one of the two die 402 (i.e., apply the adhesive to the first die or the second die, or the first die and the second die), folding the flexible substrate along a predetermined fold line or multiple fold lines 404, abutting at least the first die and the second die in a top to top configuration 406, and curing the adhesive 408. Once the die are stacked as set forth according to the method 212 described with reference to FIG. 4 or according to another method, the method 200 for forming a stacked die package continues with removing the stiffener 314 as shown in FIG. 3.

Figure 5:
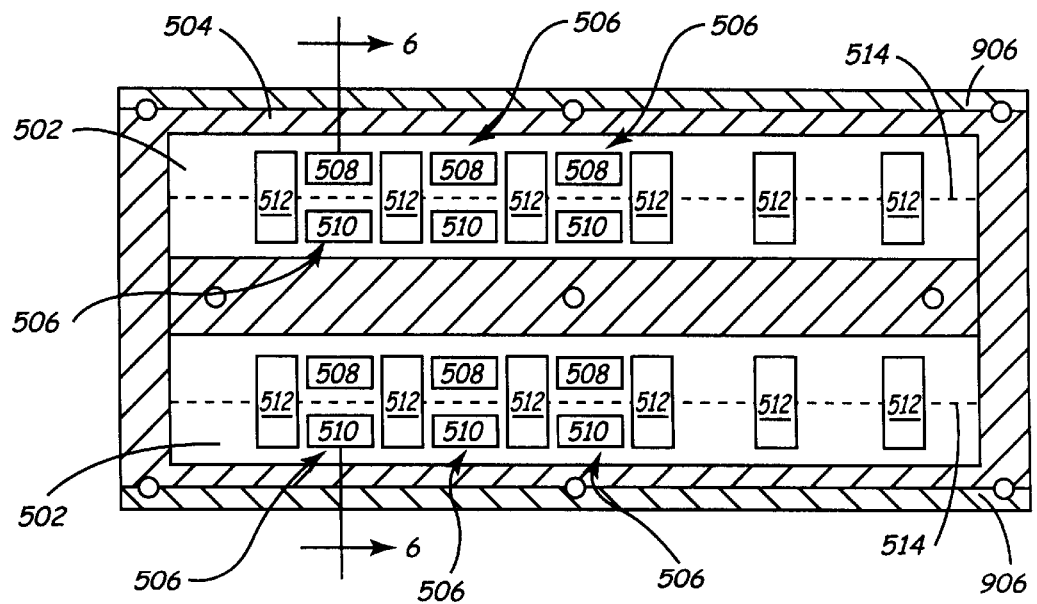
FIG. 5 is a top view of a flexible substrate stiffened with a stiffener according to one embodiment of the present invention.

Referring to FIG. 5, a flexible substrate 502 is shown that is stiffened with a stiffener 504 in accordance with the present invention. In accordance with one embodiment, the flexible substrate 502 has been preferably mounted or otherwise coupled or attached to the stiffener 504, which is illustrated as a stiffening frame. However, the stiffener 504 can be configured in any number of configurations that decrease the flexibility of the flexible substrate 502 (i.e., increase the rigidity of the flexible substrate 502).

The flexible substrate 502 is also preferably configured to have multiple sub-panels 506 (i.e., the flexible substrate 502 is arranged in a sub-panel pattern) that assist with the folding of the flexible substrate 502 and stiffener 504 during the aligning of the first die 508 and the second die 510, which are coupled and preferably mounted to the flexible substrate 502. In one embodiment, the flexible substrate 502 also includes apertures 512 arranged to facilitate folding of the flexible substrate 502 and stiffener 504 and/or arranged to facilitate singulation of the die packages corresponding to each of the multiple sub-panels 506. While one exemplary configuration of the stiffener 504 is described herein, other means or components for maintaining rigidity and workability of the flexible substrate 502 are contemplated, and are within the scope of the invention. For example, in one embodiment, a spacer is used as the stiffener 504.

Figure 6:
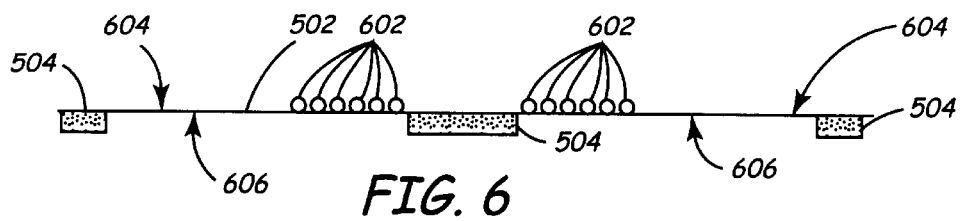
FIG. 6 is a first elevation view of the die package during the method of one embodiment of the present invention.

Referring to FIG. 6, a first perspective view of the flexible substrate 502 is shown with the attached stiffener 504. An array of solder balls 602 is formed on the second side 604 of the flexible substrate 502 in a pattern that preferably provides an overlap between at least a portion of the first die, which was previously mounted or is subsequently mounted to the first side 606. More preferably, the array of solder balls 602 is formed on the second side 604 of the flexible substrate 502 in a pattern that provides an overlap of a significant portion of the first die and a significant portion of the array of solder balls 602, and even more preferably provides a substantial alignment of the first die and the array of solder balls 602 or a complete alignment thereof.

Figure 7:
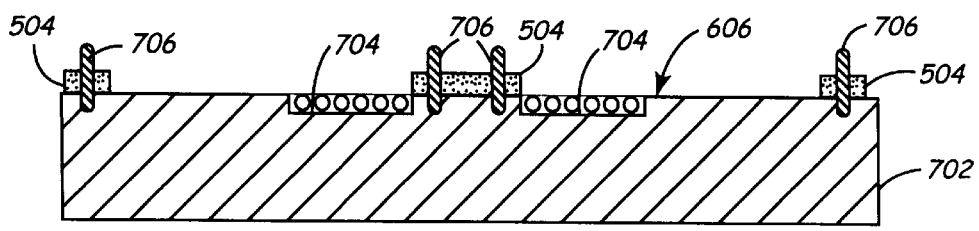
FIG. 7 is a second elevation view of the die package during the method of one embodiment of the present invention.

Referring to FIG. 7, the flexible substrate 502 and the stiffener 504 is inverted with respect to the position as shown in FIG. 6 and placed on a reflow boat 702, so that the array of solder balls 602 rest in an opening, aperture, indentation, or recess 704 of the reflow boat 702. The reflow boat 702 preferably comprises holding elements 706 (e.g., locating pins) that secure the stiffener 504 and therefore the flexible substrate 502 to the reflow boat 702. The inverted placement of the flexible substrate 502 and stiffener 504 exposes the first side 606 (i.e., the opposite side of the second side 604) of the flexible substrate 502 for further processing.

Figure 8:
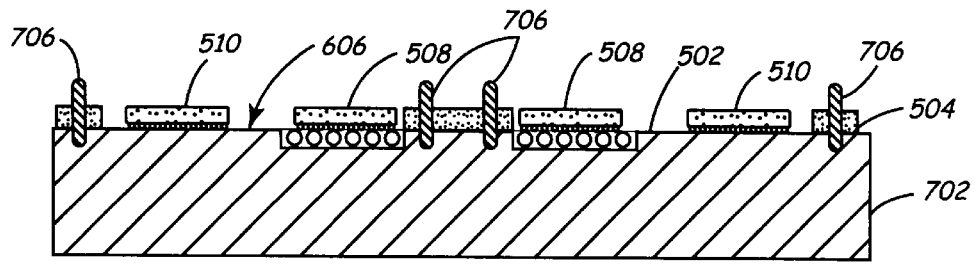
FIG. 8 is a third elevation view of the die package during the method of one embodiment of the present invention.

Referring to FIG. 8, the first die 508 and the second die 510 are mounted on the first side 606 of the flexible substrate 502 according to the predetermined pattern as previously described in this detailed description of the drawings. Preferably, the first die 508 and second die 510 are reflowed onto the first side 606. As can be appreciated by one of ordinary skill in the art, the first die 508, the second die 510, and the array of solder balls 602 can be interconnected through the flexible substrate 502 with any number of techniques.

Figure 9:
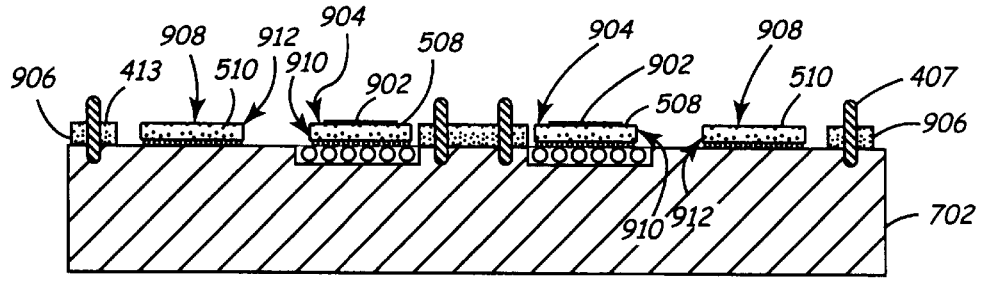
FIG. 9 is a fourth elevation view of the die package during the method of one embodiment of the present invention.

Referring to FIG. 9, an adhesive 902, which is preferably a thermo set adhesive, is placed on a first side 904 of the first die 508 in preparation for the stacking operation. After the adhesive 902 is placed on the first side 904 of the first die 508, the stiffener 504 and/or the flexible substrate 502 is altered to increase the flexibility of the flexible substrate 502 and/or the stiffener 504 (i.e., the stiffener 504 and/or the flexible substrate 502 is altered to decrease the rigidity of the flexible substrate 502 and the stiffener 504). For example, a section 906 of the stiffener 504 can be removed or part of the flexible substrate 502 can be separated from the stiffener 504. However, any number of methods can be used to at least increase the flexibility of the flexible substrate 502 as can be appreciated by one of ordinary skill in the art.

Once the stiffener 504 and/or the flexible substrate 502 is altered to at least increase the flexibility of the flexible substrate 502 and/or the stiffener 504, the flexible substrate 502 is adjusted to align the first die 508 and the second die 510. For example, the flexible substrate 502 and the stiffener 304 are folded along a predetermined fold line 514 as shown in FIG. 5 to align the first side 904 of the first die 508 and the first side 908 of the second die 510. In addition, as previously described in this detailed description of the drawings, the first die 508 and the second die 510 at least partially overlap, preferably a majority of the first die 508 and the second die 510 overlap, more preferably a substantial portion of the first die 508 and the second die 510 overlap, and even more preferably a first edge 910 of the first die 508 and the first edge 910 of the second die 510 are substantially align or aligned according to the present invention. The adhesive 902 preferably maintains the alignment of the first die 508 and the second die 510 (i.e., substantially secures or secures the die in the aligned position).

Figure 10:
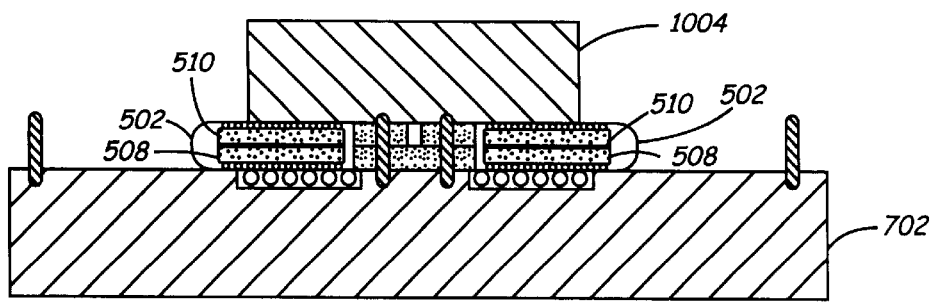
FIG. 10 is a fifth elevation view of the die package during the method of one embodiment of the present invention.

Referring to FIG. 10, a fourth perspective view is shown. Once the flexible substrate 502 and stiffener 504 are folded to align or abut the first die 508 and the second die 510, pressure is preferably applied to substantially maintain the position of the first die 508 and the second die 510. The position of the first die 508 and the second die 510 is maintained for a period while the adhesive 902 is allowed to at least partially cure. The pressure can be applied with any number of methods and apparatus such as a clamp 1004.

Figure 11:
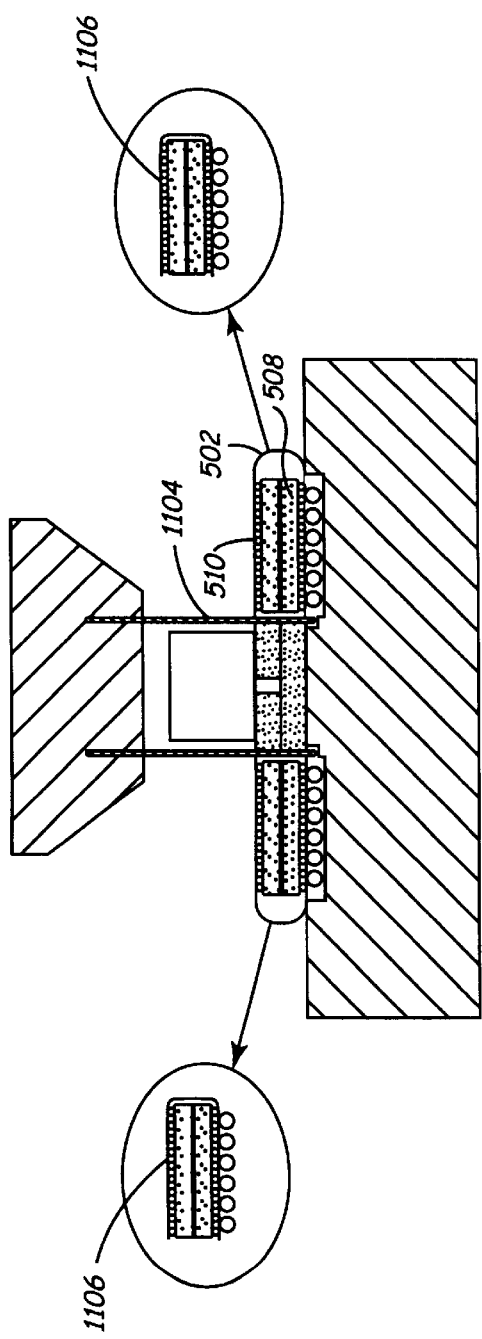
FIG. 11 is a sixth elevation view of the die package during the method of one embodiment of the present invention.

Referring to FIG. 11, once the adhesive 412 is at least partially cured, and the first die 508 and the second die 510 are arranged in a top-to-top stacked fashion as previously described in this detailed description of the drawings, the first die 508 and the second die 510 are preferably separated into individual components. For example, the first die 508 and the second die 510, flexible substrate 502 and/or the stiffener 504 are removed from the reflow boat and placed into a separation mechanism such as a saw fixture. However, any number of separation mechanisms can be used in accordance with the present invention, such as acoustic separators, optical separators (e.g., lasers), and mechanical separators, electrical separators, electromechanical separators, and the like. The separation mechanism (e.g., a wafer saw having a saw blade 1104) separates the first die 508, the second die 510, and the flexible substrate 502 forming a single die package 1106 as shown in greater detail in FIG. 12, an more preferably forms a plurality of single die packages 1106.

Figure 12:
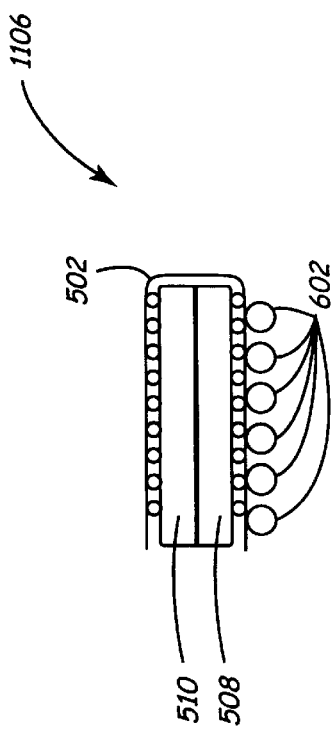
FIG. 12 is a view of a die package formed according to one embodiment of the present invention.

In order to provide single die package 1106 and preferably the plurality of die packages 1106, the first die 508 and the second die 510 are preferably arranged on the flexible substrate 502 such that minimal action is taken to separate the first die 508, the second die 510, and the flexible substrate 502 of each die package as shown in FIG. 5. As can be appreciated by one of ordinary skill in the art, the multiple sub-panels illustrated in FIG. 5 allows minimal action (e.g., cutting) to separate the first die 508, the second die 510, and the flexible substrate 502 into the die package 1106 as shown in FIG. 11 and FIG. 12. Furthermore, the arrangement of additional sub-panels can increase production and repeatability. However, other arrangements and patterns of the first die 508, second die 510, and flexible substrate 502 can be utilized in accordance with the present invention.

After separation, the methods of the present invention preferably comprise coupling the die package to a connector or other device, preferably mounting the die package to a connector or other device, and more preferably surface mounting the die package to a connector or other device. According to one embodiment of the present invention, the methods of the present invention include coupling the die package to a portable electronic product application, such as an Implantable Medical Device (IMD) (e.g., the IMD shown in FIG. 13), preferably mounting the die package to a portable electronic product application, such as an IMD, and more preferably surface mounting the die package to a portable electronic product application such as the IMD of FIG. 13.

Referring to FIG. 13, the IMD 1300 comprises a body 1302 configured to house medical device components including, by way of example only and not by way of limitation, substrates, batteries, shielding, antenna and telemetry devices and components, control circuitry, high power circuits, high voltage circuits, integrated circuits, and the like. Integrated circuits of the IMD preferably include at least one stacked die package, and preferably multiple stacked die packages. In one embodiment, the stacked die package such as a stacked die package 1106 is mounted to the substrate of the IMD by conventional surface mount techniques.

As can be appreciated by one of ordinary skill in the art, the die packages and portable electronic devices (e.g., IMDs) that are formed in accordance with the present invention can have any number of configurations and applications. For example, while the foregoing detailed description of the present invention did not directly address high voltage flip chip applications, it should be appreciated that the methods of the present invention can be used for formation of high voltage flip chip packages. For example, and with reference to FIG. 14, one embodiment of a method 1400 is presented in which a discrete die package configured as a flip chip package can be formed according to the present invention, and preferably a method in which a package of a dual active sided die (e.g., high voltage discrete die package or a high voltage flip chip package) can be formed according to the present invention.

The method 1400 is particularly beneficial in packaging high voltage discrete die and other high voltage components with low pin counts into a chip scale surface-mountable package, where "high voltage component" or "high voltage discrete die" is defined herein as a device that is operable with a potential greater than fifty (50) volts, preferably greater than one hundred (100) volts, more preferably greater than five hundred (500) volts, and even more preferably greater than one thousand (1000) volts. However, one of ordinary skill in the art will recognize that other die and components can be packaged in like manners, and the die package formed in accordance with the method 1400 can be used in a wide variety of applications. The die package or high voltage die package formed in accordance with the method 1400 can include any number of devices such as Field Effect Transistors (FETs), Metal Oxide Semiconductor (MOS) FETs (MOSFETs), Insulated Gate FETs (IGFETs), thyristors, bipolar transistors, diodes, MOS-controlled thryristors, resistors, etc.

Figure 14:
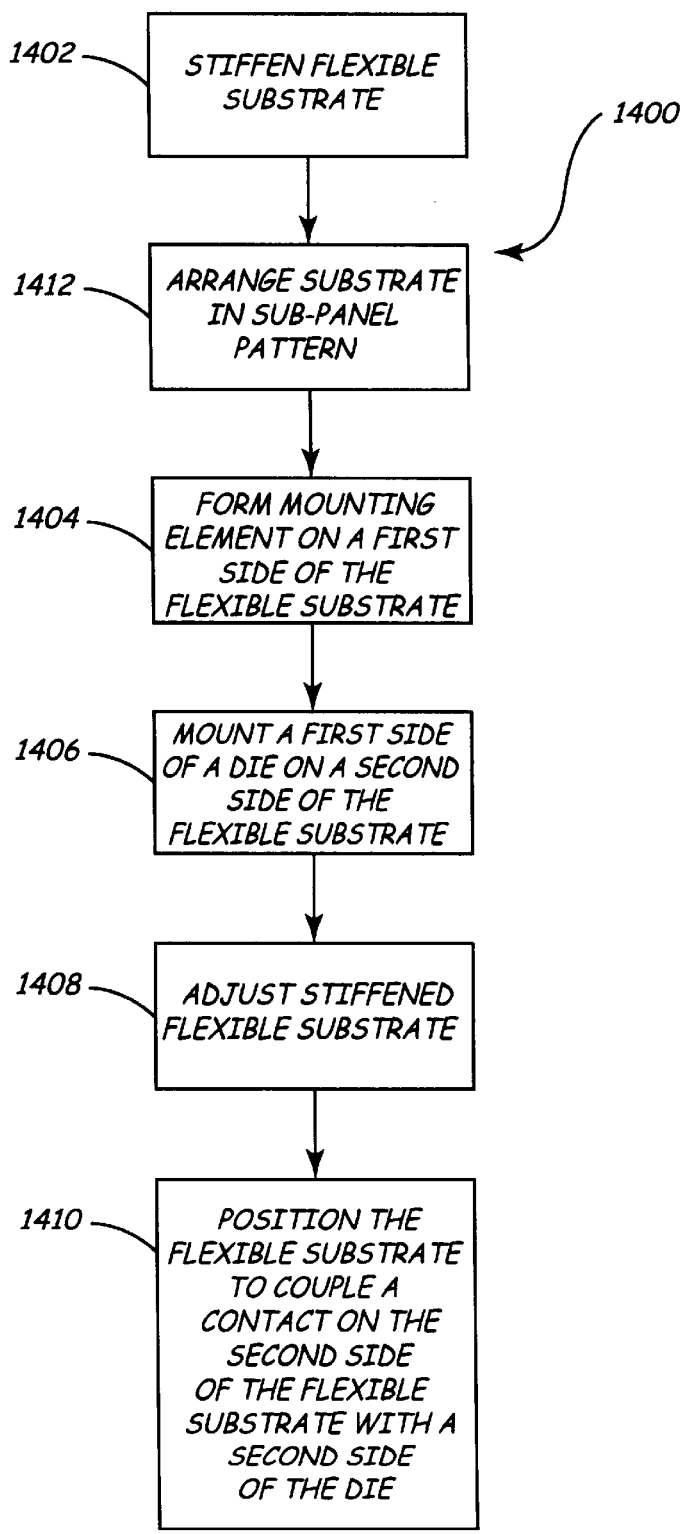
FIG. 14 is a flow chart diagram of another embodiment of a method for i forming a die package.

Continuing with reference to FIG. 14, the method comprises stiffening a flexible substrate to provide a first flexibility of the flexible substrate 1402, and forming a mounting element on a first side of the flexible substrate 1404. In addition, the method comprises mounting a first side of a die on a second side of the flexible substrate such that at least a first terminal on the first side of the first die is coupled to the mounting element 1406. Furthermore, the method 1400 comprises adjusting the stiffening of the flexible substrate to provide a second flexibility that is greater than the first flexibility 1412 and positioning the flexible substrate to couple a contact of the flexible substrate with a second side of the die.

Figure 15:
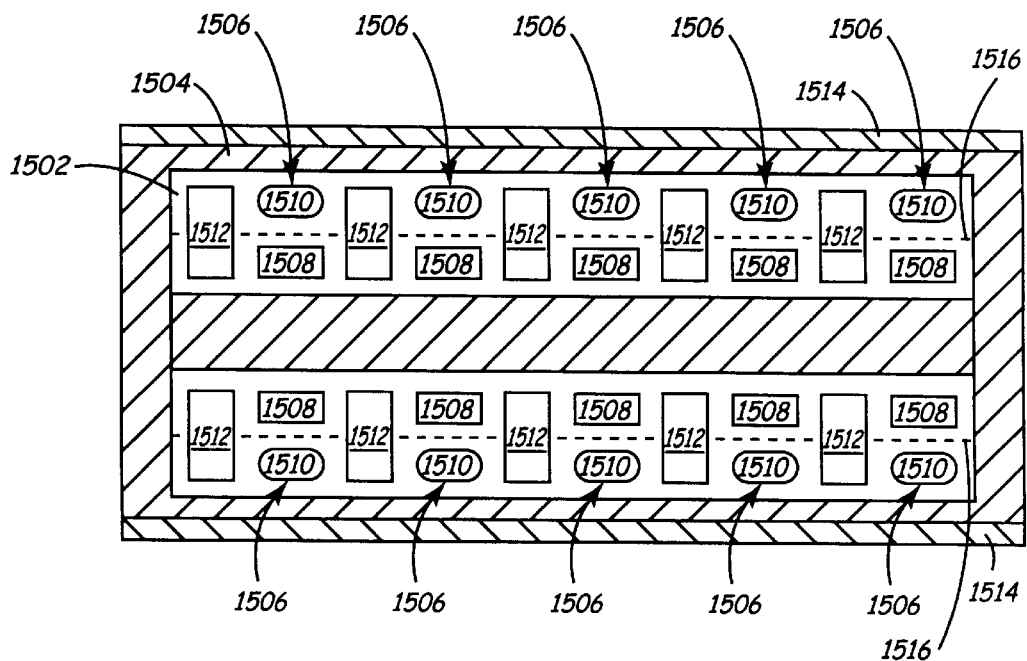
FIG. 15 is a top view of a flexible substrate stiffened with a stiffener according to another embodiment of the present invention.

Referring to FIG. 15, a flexible substrate 1502 is shown that is stiffened with a stiffener 1504 in accordance with the present invention. In accordance with one embodiment, the flexible substrate 1502 has been preferably mounted or otherwise coupled or attached to the stiffener 1504, which is illustrated as a stiffening frame. However, the stiffener 1504 can be configured in any number of configurations that decrease the flexibility of the flexible substrate 1502 (i.e., increase the rigidity of the flexible substrate 1502).

The flexible substrate 1502 is also optionally configured to have multiple sub-panels 1506. Therefore, the method 1400 as illustrated in FIG. 14 optionally comprises arranging the flexible substrate 1502 in a sub-panel pattern 1412. Continuing with reference to FIG. 15, the multiple sub-panels 1506 assist with the folding of the flexible substrate 1502 and the stiffener 1504 during the aligning of the die 1508 and the contact 1510 of the flexible substrate 1502. In one embodiment, the flexible substrate 1502 also comprises apertures 1512 arranged to facilitate folding of the flexible substrate 1502 and stiffener 1504 and/or arranged to facilitate separation of the die package corresponding to each sub-panel 1506. While one exemplary configuration of the stiffener 1504 is described herein, other means or components for increasing the rigidity of the flexible substrate 1502 are contemplated, and are within the scope of the invention. For example, in one embodiment, a spacer is used as the stiffener 1504.

Figure 16:
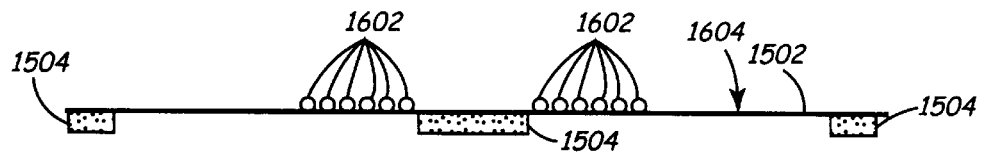
FIG. 16 is a first elevation view of the die package during the method of another embodiment of the present invention.

Referring to FIG. 16, a first perspective view of the flexible substrate 1502 is illustrated after stiffening to provide a first flexibility and forming of the mounting element 1602 on the first side 1604 of the flexible substrate 1502. The stiffening of the flexible substrate 1502 to provide the first flexibility is illustrated with the stiffener 1504 as previously described with reference to FIG. 15. The flexible substrate 1502 is preferably formed of a material that is flexible, which as previously described shall herein be generally defined as capable of modification, preferably defined as easily persuaded or influenced (i.e., tractable), and more preferably defined as the general ability to bend without breaking. The flexible substrate 1502 can be formed of any number of materials or combination of materials, such as polyimide, polyesters, fluoropolymers epoxy films, polyethylene films, and fluorocarbon films.

The mounting element 1602 is preferably formed on the first side 1604 of the flexible substrate 1502 in a predetermined pattern, and more preferably formed on the first side 1604 of the flexible substrate 1502 in a predetermined array pattern. According to a preferred embodiment of the present invention, the mounting element 1602 is a solder ball array pattern configured for surface mounting of the die package. However, any number of mounting elements can be used in accordance with the present invention.

Figure 17:
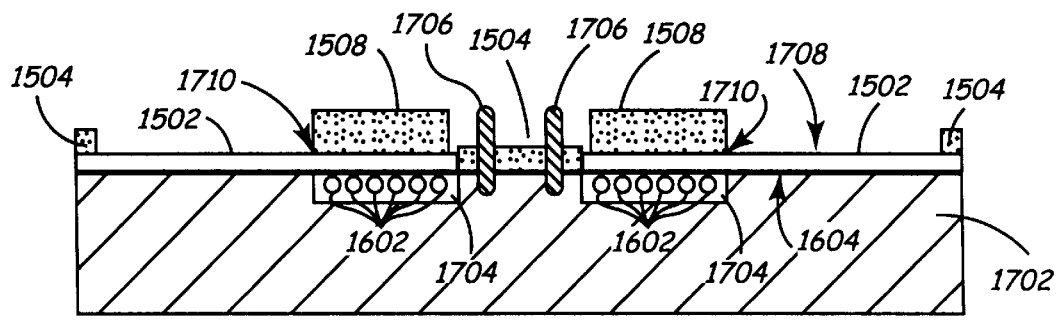
FIG. 17 is a second elevation view of the die package during the method of another embodiment of the present invention.

Referring to FIG. 17, according to one embodiment of the present invention, the flexible substrate 1502 and the stiffener 1504 are at least partially inverted with respect to the position as shown in FIG. 16 and preferably placed on a reflow boat 1702, so that the mounting element 1602 rests in an opening, aperture, indentation, or recess 1704 of the reflow boat 1702. The reflow boat 1702 preferably comprises holding elements 1706 that secure the stiffener 1504 and therefore the flexible substrate 1502 to the reflow boat 1702. The inverted placement of the flexible substrate 1502 and stiffener 1504 exposes the second side 1708 (i.e., the opposite side of the first side 1604 of the flexible substrate 1502) for further processing.

A first side 1710 of the die 1508 is mounted on the second side 1708 of the flexible substrate 1502 and preferably reflowed onto the second side 1708. As previously described in this detailed description of the drawings, the die 1508 can be an individual circuit element formed on or within a continuous substrate that is based on a single material or a composite of multiple materials (e.g., silicon). Alternatively, the die 1508 can be multiple interconnected circuits formed on or within a continuous substrate (e.g., an integrated circuit). Preferably, the die 1508 is preferably a high voltage component or high voltage discrete die as previously described in this detailed description of the drawings.

The die 1508 is preferably coupled or interconnected to the mounting element 1602 with an optical, electrical or acoustic interconnect. The die 1508 and the mounting element 1602 are preferably interconnected through the flexible substrate 1502 with interconnects and/or vias formed on or within the flexible substrate 1502. Furthermore, the die 1508 is preferably mounted on the second side 1708 of the flexible substrate 1502 such that at least a portion of the die 1502 overlaps at least a portion of the mounting element 1602 mounted on the first side 1604. More preferably, the die 1508 is mounted on the second side 1708 such that a significant portion of the die 1508 overlaps the mounting element 1602, and even more preferably mounted such that a substantial alignment or complete alignment is provided for the die 1508 and the mounting element 1602.

Figure 18:
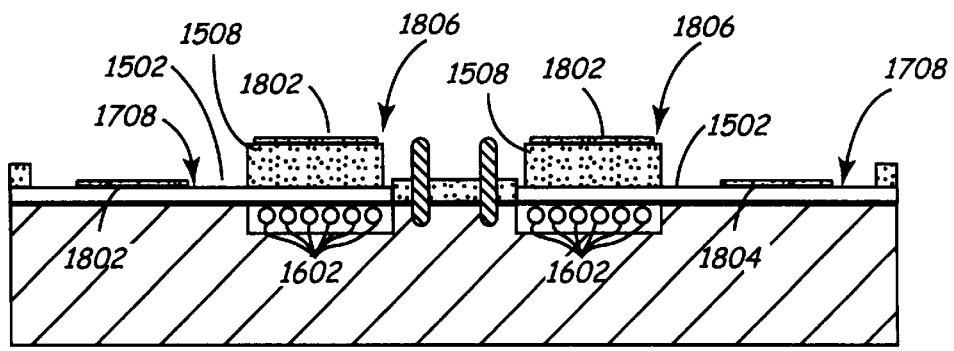
FIG. 18 is a third elevation view of the die package during the method of another embodiment of the present invention.

Referring to FIG. 18, a conducting interface 1802, which can be any number of conductors, semiconductors, or combination thereof, or a conductive adhesive, preferably a conductive thermo set adhesive, is preferably placed on at least one of the die 1508 and a contact 1804 of the flexible substrate 1502 in preparation for the positioning of the flexible substrate 1502 to couple the contact 1804 of the flexible substrate 1502 with the second side 1806 of the die 1508. The conducting interface 1802 can also be configured to conduct an optical or acoustic signal. For example, the conductive interface is preferably at least a semi-conductive electrical adhesive and more preferably a conductive electrical adhesive.

In addition to placing the conducting interface 1802 on at least one of the die 1508 and the contact 1804 of the flexible substrate 1502 in preparation for the position of the flexible substrate 1502 to couple the contact 1804 of the flexible substrate 1502 with the second side 1806 of the die 1508, the flexible substrate 1502 is preferably adjusted to at least increase the flexibility of the flexible substrate 1502 and/or the stiffener 1504 (i.e., the stiffener 1504 and/or the flexible substrate 1502 is altered to decrease the rigidity of the flexible substrate 1502 and/or the stiffener 1504). In accordance with one embodiment of the invention, a section 1514 of the stiffener 1504 can be removed or part of the flexible substrate 1502 can be separated from the stiffener 1504 as illustrated in FIG. 15. However, any number of methods can be used to provide a second flexibility of the flexible substrate 1502 that is greater than the first flexibility.

Figure 19:
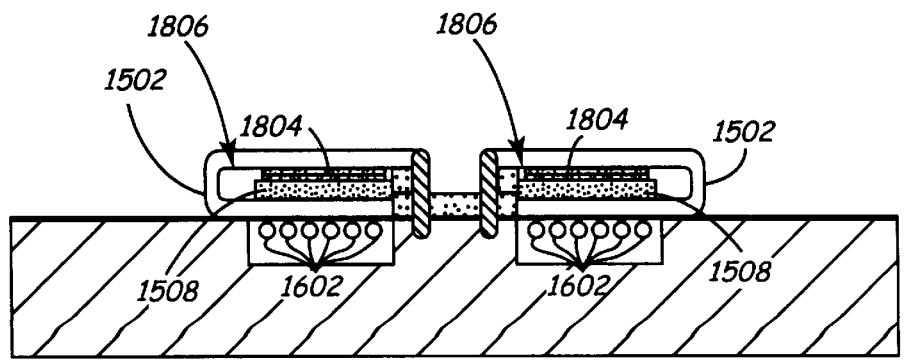
FIG. 19 is a fourth elevation view of the die package during the method of another embodiment of the present invention.

Referring to FIG. 19, once the stiffener 1504 and/or the flexible substrate 1502 is adjusted to at least increase the flexibility of the flexible substrate 1502 and/or the stiffener 1504, the flexible substrate 1502 is positioned to couple the contact 1804 to the second side 1806 of the die 1508. Preferably, the flexible substrate 1502 is positioned such that at least a portion of the contact 1804 overlaps at least a portion of the second side 1806 of the die 1508 to couple the contact 1804 or other contacts (not shown) of the flexible substrate 1502 with a contact (not shown) or multiple contacts (not shown) of the die 1508 that are accessible from the second side 1806 of the die 1508. More preferably, the flexible substrate 1502 is positioned such that a significant portion of the contact 1804 overlaps a significant portion of the second side 1806 of the die 1508 and even more preferably mounted such that a substantial alignment or complete alignment is provided for the contact 1804 the second side 1806 or the die 1508. The positioning of the flexible substrate 1502 to couple the contact 1804 to the second side 1806 of the die 1508 can be accomplished using any number of techniques. For example, the flexible substrate 1502 and/or the stiffener 1504 are folded along a predetermined fold line 1516 as shown in FIG. 15 to at least partially align the second side 1806 of the die 1508 and the contact 1804 of the flexible substrate 1502.

Pressure is preferably applied to at least one of the die 1508 and the flexible substrate 1502 and the stiffener 1504 to maintain the position of the die 1508 and the flexible substrate 1502 after the positioning. The position of the die 1508 and the flexible substrate 1502 is preferably maintained for a period while conducting interface 1802 is allowed to at least partially cure or set. The pressure can be applied with any number of methods and apparatus such as the method and apparatus as discussed with reference to FIG. 10 and as shown in FIG. 19.

Figure 20:
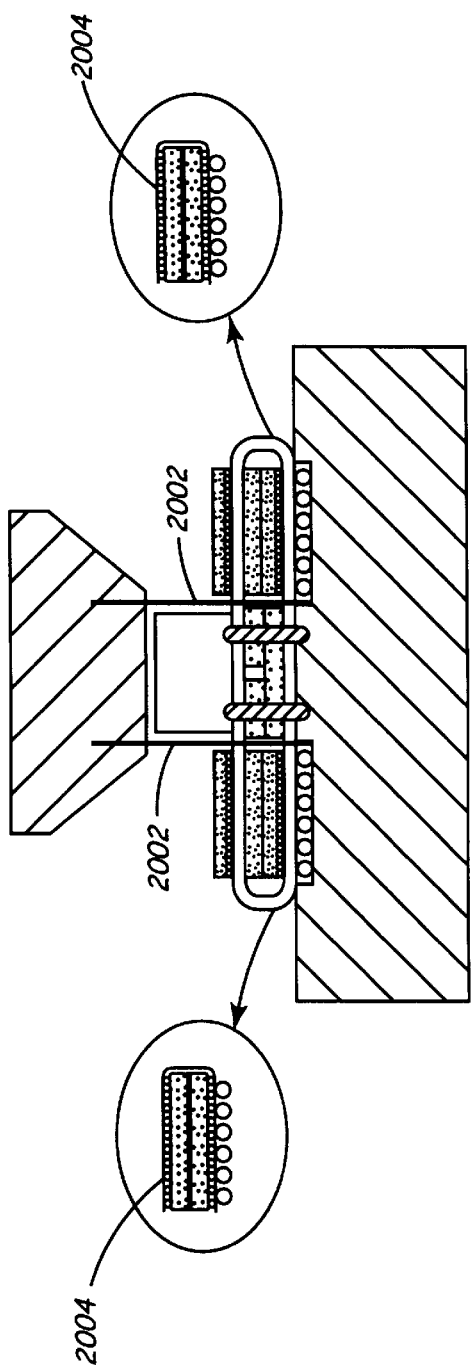
FIG. 20 is a fifth elevation view of the die package during the method of another embodiment of the present invention.

Referring to FIG. 20, once the conducting interface is at least partially cured or set, and the flexible substrate 1502 is positioned to couple the contact 1804 to the second side 1806 of the die 1508 as previously described in this detailed description of the drawings, a separation operation is conducted in accordance with the present invention to produce the die package and preferably conducted to produce a plurality of die packages. For example, the die 1508, the flexible substrate 1502 and/or the stiffener 1504 are removed from the reflow boat 1702 and placed into a separation mechanism such as a saw fixture as shown. However, any number of separation mechanisms can be used in accordance with the present invention, such as acoustic separators, optical separators (e.g., lasers), and mechanical separators, electrical separators, electromechanical separators, and the like. The separation mechanism (e.g., a wafer saw having a saw blade 2002) separates the die 1508 and the flexible substrate 1502 forming a single die package 2004 as shown in greater detail in FIG. 21.

Figure 21:
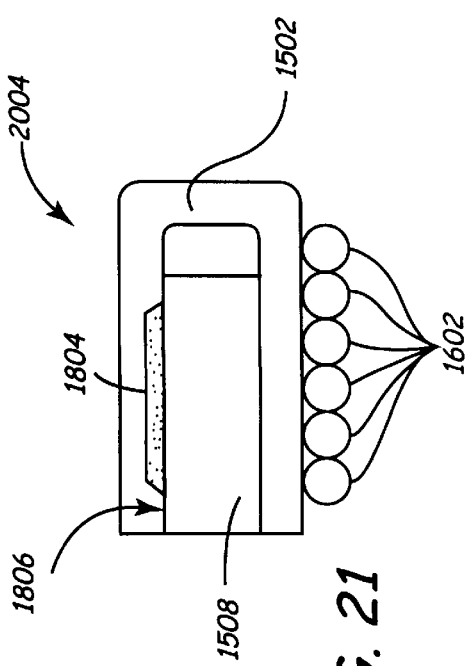
FIG. 21 is a view of a package formed according to another embodiment of the present invention.

Referring to FIG. 15, the die 1508 are preferably arranged on the flexible substrate 1502 such that minimal action is taken to separate each of the die 1508 within a subpanel, 1506 into the die package 2004 as shown in FIG. 21. In this way, minimal action is taken (e.g., minimal cutting) to separate the die package 2004 as shown in FIG. 20, and also separates the other die into other single die packages as shown. More specifically, and with reference to FIG. 1, the die package 2004 comprises the flexible substrate 1502 having the first side and the second side. The mounting element 1602 is formed on the first side 1604 of the flexible substrate 1502, and the die 1508 having a first side that is mounted on the second side of the flexible substrate 1502. The contact 1804 of the flexible substrate 1502 is coupled with the second side of the die 1508. As can be appreciated by those of ordinary skill in the art, the arrangement of the die 1508 can increase production and repeatability. However, other arrangements and patterns can be utilized in accordance with the present invention.

After separation, the methods of the present invention preferably comprise coupling the die package to a connector or other device, preferably mounting the die package to a connector or other device, and more preferably surface mounting the die package to a connector or other device. According to one embodiment of the present invention, the methods of the present invention include coupling the die package to a portable electronic product application, such as an Implantable Medical Device (IMD) (e.g., the IMD shown in FIG. 13), preferably mounting the die package to a portable electronic product application, such as an IMD, and more preferably surface mounting the die package to a portable electronic product application such as the IMD of FIG. 13.

From the foregoing description, it should be appreciated that methods are provided for forming a die package that present significant benefits, which have been presented in the background of the invention, summary, brief description of the drawings, and detailed description of the drawings and also present significant benefits that would be apparent to one or ordinary skill in the art. Furthermore, while embodiments have been presented in the foregoing detailed description of the drawings, it should be appreciated that a vast number of variations in the embodiments exist. It should also be appreciated that these embodiments are preferred exemplary embodiments only, and are not intended to limit the scope, applicability, or configuration of the invention in any way. Rather, the foregoing detailed description provides those skilled in the art with a convenient road map for implementing a preferred exemplary embodiment of the invention. It being understood that various changes may be made in the function and arrangement of elements described in this detailed description of the drawings without departing from the spirit and scope of the invention as set forth in the appended claims.

What is claimed is:

1. A method for forming a die package, comprising:
   stiffening a flexible substrate to provide a first flexibility of said flexible substrate;
   forming a mounting element on a first side of said flexible substrate;
   mounting a first side of a die on a second side of said flexible substrate;
   adjusting said stiffening to provide a second flexibility of said flexible substrate that is greater than said first flexibility; and
   positioning said flexible substrate to couple a contact of said flexible substrate with a second side of said die.

2. The method for forming the die package of claim 1, wherein said die is operable with a potential greater than fifty (50) volts.

3. The method for forming the die package of claim 1, wherein said die is operable with a potential greater than one hundred (100) volts.

4. The method for forming the die package of claim 1, wherein said die is operable with a potential greater than five hundred (500) volts.

5. The method for forming the die package of claim 1, wherein said die is operable with a potential greater than one thousand (1000) volts.

6. The method for forming the die package of claim 1, wherein said die package is a device selected from the group comprising a Field Effect Transistor (FET), Metal Oxide Semiconductor (MOS) FET (MOSFET), Insulated Gate FET (IGFET), thyristors, bipolar transistors, diodes, MOS-controlled thryristors, and resistors.

7. The method for forming the die package of claim 1, wherein said stiffening said flexible substrate to provide said first flexibility of said flexible substrate comprises coupling said flexible substrate to a stiffener.

8. The method for forming the die package of claim 7, further comprising securing said stiffener to a reflow boat.

9. The method for forming the die package of claim 7, wherein said adjusting said stiffening to provide a second flexibility of said flexible substrate that is greater than said first flexibility comprises removing a section of said stiffener.

10. The method for forming the die package of claim 1, wherein said flexible substrate is a material selected from the group comprising a polyimide, polyester, fluoropolymer epoxy, polyethylene, and a fluorocarbon.

11. The method for forming the die package of claim 1, wherein said forming said mounting element on said first side of said flexible substrate comprises forming said mounting element in a predetermined array pattern.

12. The method for forming the die package of claim 1, wherein said forming said mounting element on said first side of said flexible substrate comprises forming a solder ball array pattern.

13. The method for forming the die package of claim 1, further comprising placing said flexible substrate on a reflow boat.

14. The method for forming the die package of claim 1, wherein said mounting said first side of said die on said second side of said flexible substrate comprises reflowing said first side of said die on said second side of said flexible substrate.

15. The method for forming the die package of claim 1, further comprising placing a conducting interface on at least one of said die and a contact of said flexible substrate.

16. The method for forming the die package of claim 15, wherein said conducting interface is a conductive adhesive.

17. The method for forming the die package of claim 1, wherein said mounting said first side of said die on said second side of said flexible substrate results in at least a portion of said die overlapping at least a portion of said mounting element.

18. The method of forming the die package of claim 1, further comprising conducting a separation operation with said die and said flexible substrate.

19. A method of forming a portable electronic product application, comprising:
    forming a die package, comprising:
       stiffening a flexible substrate to provide a first flexibility of said flexible substrate;
       forming a mounting element on a first side of said flexible substrate;
       mounting a first side of a die on a second side of said flexible substrate;

adjusting said stiffening to provide a second flexibility of said flexible substrate that is greater than said first flexibility; and positioning said flexible substrate to couple a contact of said flexible substrate with a second side of said die; and coupling said die package to the portable electronic product application.

20. The method of forming the portable electronic product application of claim 19, wherein said coupling said die package to the portable electronic product application comprises mounting said die package to the portable electronic product application.

21. The method of forming the portable electronic product application of claim 19, wherein said coupling said die package to the portable electronic product application comprises surface mounting said die package to the portable electronic product application.

22. The method of forming the portable electronic product application of claim 19, wherein said portable electronic product application is an Implantable Medical Device (IMD).

23. The method of forming the portable electronic product application of claim 19, wherein said die is operable with a potential greater than fifty (50) volts.

24. The method of forming the portable electronic product application of claim 19, wherein said die is operable with a potential greater than one hundred (100) volts.

25. The method of forming the portable electronic product application of claim 19, wherein said die is operable with a potential greater than five hundred (500) volts.

26. The method of forming the portable electronic product application of claim 19, wherein said die is operable with a potential greater than one thousand (1000) volts.

27. The method of forming the portable electronic product application of claim 19, wherein said die package is a device selected from the group comprising a Field Effect Transistor (FET), Metal Oxide Semiconductor (MOS) FET (MOSFET), Insulated Gate FET (IGFET), thyristors, bipolar transistors, diodes, MOS-controlled thryristors, and resistors.

28. The method of forming the portable electronic product application of claim 19, wherein said stiffening said flexible substrate to provide said first flexibility of said flexible substrate comprises coupling said flexible substrate to a stiffener.

29. The method of forming the portable electronic product application of claim 28, further comprising securing said stiffener to a reflow boat.

30. The method of forming the portable electronic product application of claim 28, wherein said adjusting said stiffening to provide a second flexibility of said flexible substrate that is greater than said first flexibility comprises removing a section of said stiffener.

31. The method of forming the portable electronic product application of claim 19, wherein said flexible substrate is a material selected from the group comprising a polyimide, polyester, fluoropolymer epoxy, polyethylene, and a fluorocarbon.

32. The method of forming the portable electronic product application of claim 19, wherein said forming said mounting element on said first side of said flexible substrate comprises forming said mounting element in a predetermined array pattern.

33. The method of forming the portable electronic product application of claim 19, wherein said forming said mounting element on said first side of said flexible substrate comprises forming a solder ball array pattern.

34. The method of forming the portable electronic product application of claim 19, further comprising placing said flexible substrate on a reflow boat.

35. The method of forming the portable electronic product application of claim 19, wherein said mounting said first side of said die on said second side of said flexible substrate comprises reflowing said first side of said die on said second side of said flexible substrate.

36. The method of forming the portable electronic product application of claim 19, further comprising placing a conducting interface on at least one of said die and a contact of said flexible substrate.

37. The method of forming the portable electronic product application of claim 36, wherein said conducting interface is a conductive adhesive.

38. The method of forming the portable electronic product application of claim 19, wherein said mounting said first side of said die on said second side of said flexible substrate results in at least a portion of said die overlapping at least a portion of said mounting element.

39. The method of forming the portable electronic product application of claim 19, further comprising conducting a separation operation with said die and said flexible substrate.

* * * * *